United States Patent
Allman et al.

(10) Patent No.: US 6,201,253 B1
(45) Date of Patent: Mar. 13, 2001

(54) METHOD AND APPARATUS FOR DETECTING A PLANARIZED OUTER LAYER OF A SEMICONDUCTOR WAFER WITH A CONFOCAL OPTICAL SYSTEM

(75) Inventors: Derryl D. J. Allman, Colorado Springs; David W. Daniel, Divide; John W. Gregory, Colorado Springs, all of CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/177,335

(22) Filed: Oct. 22, 1998

(51) Int. Cl.[7] .................................................. G01N 21/86
(52) U.S. Cl. ................................. 250/559.27; 250/559.4; 356/381
(58) Field of Search ..................... 250/559.27, 559.14, 250/559.22, 559.33; 356/381, 375, 376; 451/6, 287, 288

(56) References Cited

U.S. PATENT DOCUMENTS

| | | | |
|---|---|---|---|
| 3,734,620 | 5/1973 | Cade | 356/73 |
| 3,748,014 | 7/1973 | Beiser . | |
| 4,312,732 | 1/1982 | Degenkolb et al. | 204/192 |
| 4,374,915 | 2/1983 | Ahlquist et al. . | |
| 4,632,724 | 12/1986 | Chesebro et al. . | |
| 4,689,491 | 8/1987 | Lindow et al. . | |
| 4,793,895 | 12/1988 | Kaanta et al. | 156/627 |
| 5,036,015 | 7/1991 | Sandhu et al. | 437/8 |
| 5,081,421 | 1/1992 | Miller et al. | 324/671 |
| 5,151,584 | 9/1992 | Ebbing et al. | 250/201.4 |
| 5,169,491 | 12/1992 | Doan | 156/636 |
| 5,196,353 | 3/1993 | Sandhu et al. | 437/8 |
| 5,222,329 | 6/1993 | Yu | 51/165.77 |
| 5,240,552 | 8/1993 | Yu et al. | 156/636 |
| 5,245,790 | 9/1993 | Jerbic . | |
| 5,245,794 | 9/1993 | Salugsugan | 51/165.74 |
| 5,258,093 | 11/1993 | Maniar . | |
| 5,265,378 | 11/1993 | Rostoker | 51/165.75 |
| 5,272,115 | 12/1993 | Sato | 437/228 |
| 5,308,438 | 5/1994 | Cote et al. | 156/636 |
| 5,310,455 | 5/1994 | Pasch et al. | 156/636 |
| 5,321,304 | 6/1994 | Rostoker . | |
| 5,337,015 | 8/1994 | Lustig et al. | 324/671 |
| 5,362,669 | 11/1994 | Boyd et al. | 437/67 |
| 5,385,866 | 1/1995 | Bartush | 437/186 |
| 5,389,194 | 2/1995 | Rostoker et al. | 437/288 |
| 5,399,234 | 3/1995 | Yu et al. | 156/636 |
| 5,403,228 | 4/1995 | Pasch | 451/259 |
| 5,405,806 | 4/1995 | Pfiester et al. | 437/200 |
| 5,439,551 | 8/1995 | Meikle et al. | 156/626.1 |
| 5,449,314 | 9/1995 | Meikle et al. | 451/41 |
| 5,483,568 | 1/1996 | Yano et al. | 378/44 |
| 5,492,594 | 2/1996 | Burke et al. | 216/86 |
| 5,516,400 | 5/1996 | Pasch et al. . | |
| 5,531,861 | 7/1996 | Yu et al. | 156/636.1 |
| 5,559,428 | 9/1996 | Li et al. | 324/71.5 |
| 5,561,541 | 10/1996 | Sharp et al. | 359/66 |
| 5,595,526 | 1/1997 | Yau et al. | 451/8 |
| 5,597,442 | 1/1997 | Chen et al. | 156/626.1 |
| 5,597,590 | 1/1997 | Tanimoto et al. . | |
| 5,607,341 | 3/1997 | Leach | 451/41 |

(List continued on next page.)

Primary Examiner—Que T. Le (57) ABSTRACT

A method of planarizing a first side of a semiconductor wafer with a polishing system includes the step of polishing the first side of the wafer in order to remove material from the wafer. The method also includes the step of moving a lens of a confocal optical system between a number of lens positions so as to maintain focus on the first side of the wafer during the polishing step. The method further includes the step of determining a rate-of-movement value based on movement of the lens during the moving step. Moreover, the method includes the step of stopping the polishing step if the rate-of-movement value has a predetermined relationship with a movement threshold value. An apparatus for polishing a first side of a semiconductor wafer is also disclosed.

10 Claims, 7 Drawing Sheets

U.S. PATENT DOCUMENTS

| | | | |
|---|---|---|---|
| 5,609,511 | 3/1997 | Moriyama et al. | 451/5 |
| 5,614,446 | 3/1997 | Ramaswami et al. | 437/228 |
| 5,624,304 | 4/1997 | Pasch et al. | 451/287 |
| 5,626,715 | 5/1997 | Rostoker | 438/4 |
| 5,627,110 | 5/1997 | Lee et al. | 438/692 |
| 5,637,185 | 6/1997 | Murarka et al. | 438/5 |
| 5,639,388 | 6/1997 | Kimura et al. | 216/84 |
| 5,643,046 | 7/1997 | Katakabe et al. | 451/6 |
| 5,643,050 | 7/1997 | Chen | 451/10 |
| 5,643,061 | 7/1997 | Jackson et al. | 451/289 |
| 5,644,221 | 7/1997 | Li et al. | 324/71.5 |
| 5,645,682 | 7/1997 | Skrovan . | |
| 5,647,952 | 7/1997 | Chen | 156/636.1 |
| 5,656,229 | 8/1997 | Tanimoto et al. | 264/400 |
| 5,658,183 | 8/1997 | Sandhu et al. | 451/5 |
| 5,660,672 | 8/1997 | Li et al. | 156/345 |
| 5,663,101 | 9/1997 | Cronin | 438/632 |
| 5,663,797 | 9/1997 | Sandhu | 438/16 |
| 5,664,987 | 9/1997 | Rentein | 451/21 |
| 5,667,424 | 9/1997 | Pan | 451/6 |
| 5,667,433 | 9/1997 | Mallon | 451/287 |
| 5,667,629 | 9/1997 | Pan et al. | 438/13 |
| 5,668,063 | 9/1997 | Fry et al. | 438/5 |
| 5,670,410 | 9/1997 | Pan | 437/60 |
| 5,672,091 | 9/1997 | Takahashi et al. | 451/6 |
| 5,674,784 | 10/1997 | Jang et al. | 437/195 |
| 5,681,215 | 10/1997 | Sherwood | 568/215 |
| 5,691,253 | 11/1997 | Kobayashi | 438/690 |
| 5,695,660 | 12/1997 | Litvak | 216/85 |
| 5,700,180 | 12/1997 | Sandhu et al. | 451/5 |
| 5,702,292 | 12/1997 | Brunelli et al. | 451/41 |
| 5,704,987 | 1/1998 | Huynh et al. | 134/6 |
| 5,705,320 | 1/1998 | Hsu et al. . | |
| 5,705,435 | 1/1998 | Chen | 438/8 |
| 5,710,076 | 1/1998 | Dai et al. | 438/305 |
| 5,712,185 | 1/1998 | Tsai et al. | 437/67 |
| 5,716,873 | 2/1998 | Prall et al. . | |
| 5,720,845 | 2/1998 | Liu . | |
| 5,722,875 | 3/1998 | Iwashita et al. | 451/8 |
| 5,722,877 | 3/1998 | Meyer et al. . | |
| 5,725,417 | 3/1998 | Robinson . | |
| 5,736,462 | 4/1998 | Takahashi et al. . | |
| 5,738,567 | 4/1998 | Manzonie et al. . | |
| 5,741,171 | 4/1998 | Sarfaty et al. | 451/6 |
| 5,747,380 | 5/1998 | Yu et al. . | |
| 5,755,614 | 5/1998 | Adams et al. . | |
| 5,762,536 | 6/1998 | Pant et al. . | |
| 5,762,537 | 6/1998 | Sandhu et al. . | |
| 5,777,739 | 7/1998 | Sandhu et al. | 356/357 |
| 5,795,495 | 8/1998 | Meikle . | |
| 5,861,055 | 1/1999 | Allman et al. . | |
| 5,865,666 | 2/1999 | Nagahara . | |
| 5,868,608 | 2/1999 | Allman et al. . | |
| 5,882,244 | 3/1999 | Hiyama et al. . | |
| 5,882,251 | 3/1999 | Berman et al. . | |
| 5,888,120 | 3/1999 | Doran . | |
| 5,893,756 | 4/1999 | Berman et al. . | |
| 5,931,719 | 8/1999 | Nagahara et al. . | |
| 5,938,502 * | 8/1999 | Kubo | 451/6 |
| 5,948,697 | 9/1999 | Hata . | |
| 5,957,757 | 9/1999 | Berman . | |

* cited by examiner

Fig. 6

METHOD AND APPARATUS FOR DETECTING A PLANARIZED OUTER LAYER OF A SEMICONDUCTOR WAFER WITH A CONFOCAL OPTICAL SYSTEM

TECHNICAL FIELD OF THE INVENTION

The present invention relates generally to a method and apparatus for detecting a planarized outer layer of a semiconductor wafer, and more particularly to a method and apparatus for detecting a planarized outer layer of a semiconductor wafer by monitoring movement of an objective lens associated with a confocal optical system during polishing of the semiconductor wafer.

BACKGROUND OF THE INVENTION

Semiconductor integrated circuits are typically fabricated by a layering process in which several layers of material are fabricated on or in a surface of a wafer, or alternatively, on a surface of a previous layer. This fabrication process typically requires subsequent layers to be fabricated upon a smooth, planar surface of a previous layer. However, the surface topography of layers may be uneven due to an uneven topography associated with an underlying layer. As a result, a layer may need to be polished in order to present a smooth, planar surface for a subsequent processing step. For example, a layer may need to be polished prior to formation of a conductor layer or pattern on an outer surface of the layer.

In general, a semiconductor wafer may be polished to remove high topography and surface defects such as scratches, roughness, or embedded particles of dirt or dust. The polishing process typically is accomplished with a polishing system that includes top and bottom platens (e.g. a polishing table and a wafer carrier or holder), between which the semiconductor wafer is positioned. The platens are moved relative to each other thereby causing material to be removed from the surface of the wafer. This polishing process is often referred to as mechanical planarization (MP) and is utilized to improve the quality and reliability of semiconductor devices. The polishing process may also involve the introduction of a chemical slurry to facilitate higher removal rates, along with the selective removal of materials fabricated on the semiconductor wafer. This polishing process is often referred to as chemical mechanical planarization or chemical mechanical polishing (CMP).

In these polishing processes, it is often important to determine when an outer layer or film has been polished to a desired planarity level. In particular, it is desirable to know when the outer layer of the semiconductor wafer has been polished to a planarity level which is acceptable for presentation of the wafer to a subsequent fabrication process.

In order to determine when a wafer has been polished to a desired planarity level, systems and techniques have heretofore been utilized which polish the wafer down to a predetermined thickness. For example, a typical method employed for determining when the wafer has been polished down to a predetermined thickness is to measure the amount of time needed to planarize a first wafer to the desired thickness, and thereafter polishing the remaining wafers for a similar amount of time. In practice this method is extremely time consuming since machine operators must inspect each wafer (e.g. measure the thickness thereof) after polishing. In particular, it is extremely difficult to precisely control the removal rate of material since the removal rate may vary during the polishing of an individual wafer. Moreover, the removal rate may be diminished in the process of polishing a number of wafers in sequence. Yet further, such methods do not actually measure the planarity of the outer layer, but rather simply make an assumption that the outer layer has been polished to an acceptable planarity level when the wafer is polished to the desired thickness.

Another method employed for determining if the wafer has reached the desired thickness is to impinge a light beam, such as a laser light beam, onto the semiconductor wafer in order to determine the thickness of the wafer. Various techniques have been used to detect when an outer film associated with the semiconductor wafer reaches the desired thickness. For example, the apparatus disclosed in U.S. Pat. No. 5,151,584 issued to Ebbing et al directs an incident laser beam onto the surface of a semi-transparent thin film (e.g. silicon dioxide) of a semiconductor wafer during etching thereof. A first portion of the incident beam is reflected from the top surface of the film, and a second portion of the incident beam is reflected from the bottom surface of the film. Since the film has a finite thickness, the two reflections will either constructively or destructively interfere with one another. As the layer is etched, its thickness is changed thereby cycling intensity of the reflected beam through constructive and destructive interference patterns which may be utilized to determine when the wafer has been etched to the desired thickness. Such a technique has a number of drawbacks associated therewith. For example, such a technique may only be utilized after certain steps in the fabrication process. For example, such a technique may be useful for measuring thickness of a blank wafer, but has been found to perform unsatisfactorily when utilized to measure thickness of a patterned wafer. Moreover, similarly to the manual inspection method discussed above, such a technique does not actually measure the planarity of the outer layer, but rather simply makes an assumption that the outer layer has been polished to an acceptable planarity level when the wafer is etched down to the desired thickness.

In order to overcome the above-mentioned drawbacks associated with wafer thickness-based polishing endpoint techniques, a number of techniques have heretofore been utilized in an attempt to measure the actual planarity of the outer layer of the wafer. For example, a method which has heretofore been employed for determining when the wafer has been polished to a desired planarity level is to periodically remove the wafer from the polishing system, and thereafter measure the planarity of the wafer with an instrument such as an atomic force microscope or a profilometer. If the wafer has been polished to the desired planarity level, the wafer is released to a subsequent fabrication step. However, if the wafer has not been polished to the desired planarity level, the wafer must be placed back into the polishing system for further polishing thereof. It should be appreciated that numerous measurements may be required to reach the desired planarity level. Hence, in practice this method is extremely time consuming since machine operators must measure each wafer (i.e. measure the planarity thereof) a number of times during the polishing process.

Thus, a continuing need exists for a method and an apparatus for in situ measurement of the planarity of the outer layer of a semiconductor wafer during polishing thereof.

SUMMARY OF THE INVENTION

In accordance with a first embodiment of the present invention, there is provided a method of planarizing a first side of a semiconductor wafer with a polishing system. The method includes the step of polishing the first side of the wafer in order to remove material from the wafer. The method also includes the step of moving a lens of a confocal optical system between a number of lens positions so as to maintain focus on the first side of the wafer during the polishing step. The method further includes the step of determining a rate-of-movement value based on movement of the lens during the moving step. Moreover, the method includes the step of stopping the polishing step if the rate-of-movement value has a predetermined relationship with a movement threshold value.

Pursuant to a second embodiment of the present invention, there is provided a method of planarizing a first side of a semiconductor wafer. The method includes the step of polishing the first side of the wafer in order to remove material from the wafer. The method also includes the step of transmitting a first incident light beam from a confocal optical system during a first time period. The first incident light beam impinges on the first side of the wafer during the polishing step so as to form a first reflected light beam which is reflected from the first side of the wafer. The method further includes the step of analyzing the first reflected light beam so as to determine if the confocal optical system is focused on the first side of the wafer during the first time period. The method yet further includes the step of transmitting a second incident light beam from the confocal optical system during a second time period. The second incident light beam impinges on the first side of the wafer during the polishing step so as to form a second reflected light beam which is reflected from the first side of the wafer. The method moreover includes the step of analyzing the second reflected light beam so as to determine if the confocal optical system is focused on the first side of the wafer during the second time period. Finally, the method includes the step of stopping the polishing step if the confocal optical system is focused on the first side of the wafer during both the first time period and the second time period.

Pursuant to a third embodiment of the present invention, there is provided an apparatus for polishing a first side of a semiconductor wafer. The apparatus includes a polishing system which operates to polish the wafer. The polishing system has a polishing platen which includes a polishing surface, and a wafer carrier which is configured to engage the wafer by a second side of the wafer, and apply pressure to the wafer in order to press the wafer against the polishing surface of the polishing platen. The apparatus also includes a confocal optical system having a movable objective lens. The confocal optical system is configured to move the objective lens between a number of lens positions so as to maintain focus on the first side of the wafer during polishing of the wafer. The apparatus further includes a controller electrically coupled to the confocal optical system. The controller is configured to determine a rate-of-movement value based on movement of the objective lens during polishing of the wafer, and terminate operation of the polishing system so as to cease polishing of the wafer in response to determination that the rate-of-movement value has a predetermined relationship with a movement threshold value.

Pursuant to a fourth embodiment of the present invention, there is provided an apparatus for polishing a first side of a semiconductor wafer. The apparatus includes a polishing system which operates to polish the wafer. The polishing system has a polishing platen which includes a polishing surface. The polishing system also includes a wafer carrier which is configured to engage the wafer by a second side of the wafer and apply pressure to the wafer in order to press the wafer against the polishing surface of the polishing platen. The apparatus also includes a confocal optical system positioned such that a first incident light beam transmitted by the confocal optical system is impinged upon the first side of the wafer during a first period of time so as to form a first reflected light beam which is reflected from the first side of the wafer. The confocal optical system is also positioned such that a second incident light beam transmitted by the confocal optical system is impinged upon the first side of the wafer during a second period of time so as to form a second reflected light beam which is reflected from the first side of the wafer. Yet further, the confocal optical system is positioned such that the first and second reflected light beams are received with the confocal optical system. The apparatus also includes a controller electrically coupled to the confocal optical system. The controller is configured to analyze the first reflected light beam so as to determine if the confocal optical system is focused on the first side of the wafer during the first time period, analyze the second reflected light beam so as to determine if the confocal optical system is focused on the first side of the wafer during the second time period, and terminate operation of the polishing system so as to cease polishing of the wafer in response to determination that the confocal optical system is focused on the first side of the wafer during both the first time period and the second time period.

It is an object of the present invention to provide a new and useful method and apparatus for determining when a semiconductor wafer has been polished to a desired planarity level.

It is also an object of the present invention to provide an improved method and apparatus for determining when a semiconductor wafer has been polished to a desired planarity level.

It is yet further an object of the present invention to provide a method and apparatus for determining when a semiconductor wafer has been polished to a desired planarity level that is less mechanically complex relative to polishing systems which have heretofore been designed.

It is moreover an object of the present invention to provide a method and apparatus for determining when a semiconductor wafer has been polished to a desired planarity level that is less mechanically complex relative to polishing systems which have heretofore been designed, yet detects the planarity level of the semiconductor wafer during polishing thereof.

It is also an object of the present invention to provide a method and apparatus for determining when a semiconductor wafer has been polished to a desired planarity level which does not require chemical analysis of the slurry associated with the polishing system.

The above and other objects, features, and advantages of the present invention will become apparent from the following description and the attached drawings.

DETAILED DESCRIPTION OF A PREFERRED EMBODIMENT

While the invention is susceptible to various modifications and alternative forms, specific embodiments thereof have been shown by way of example in the drawings and will herein be described in detail. It should be understood, however, that there is no intent to limit the invention to the particular forms disclosed, but on the contrary, the intention is to cover all modifications, equivalents, and alternatives falling within the spirit and scope of the invention as defined by the appended claims.

Figure 1A:
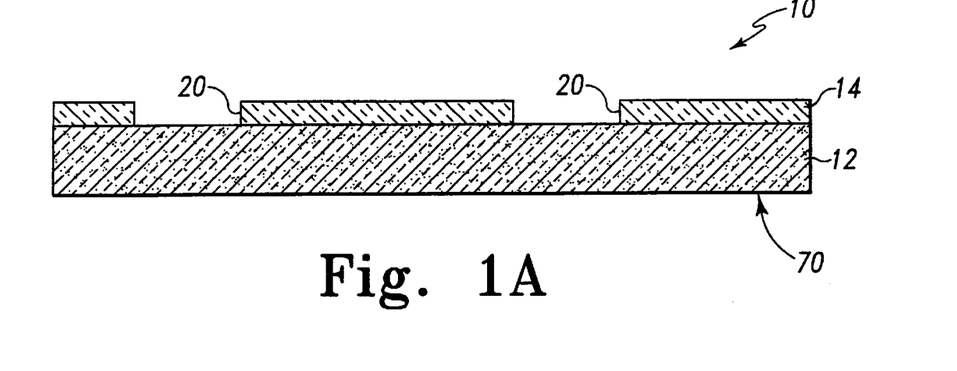
FIGS. 1A–1F how sectional views of a semiconductor wafer during various steps of a fabrication process.
Figure 1B:
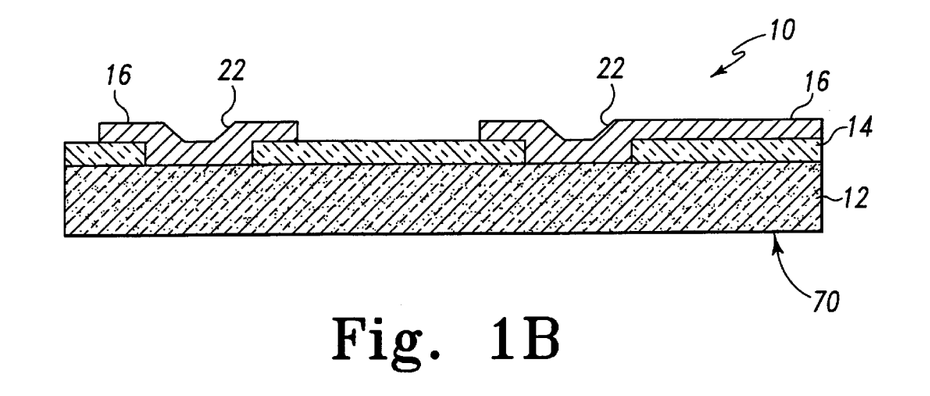

Referring now to FIGS. 1A–1F, there is shown a semiconductor wafer 10 after various steps of a fabrication process of the present invention. In particular, as shown in FIGS. 1A and 1B, the semiconductor wafer 10 includes a semiconductor substrate 12, such as silicon. A first insulating layer 14 and a first metal layer 16 are deposited or otherwise disposed on the semiconductor substrate 12. More specifically, the fabrication process deposits the first insulating layer 14 on the semiconductor substrate 12 such that a contact hole 20 is formed in the first insulating layer 14 at a location above a transistor portion of the semiconductor substrate 12. Moreover, the fabrication process patterns the first metal layer 16 (e.g. aluminum) over the first insulating layer 14 and the contact hole 20. As a result, the first metal layer 16 fills the contact hole 20 thereby forming an electrical contact with the transistor portion of the semiconductor substrate 12. Moreover, the filling of the contact hole 20 forms a pit 22 in the portion of the first metal layer 16 disposed above the contact hole 20.

Figure 1C:
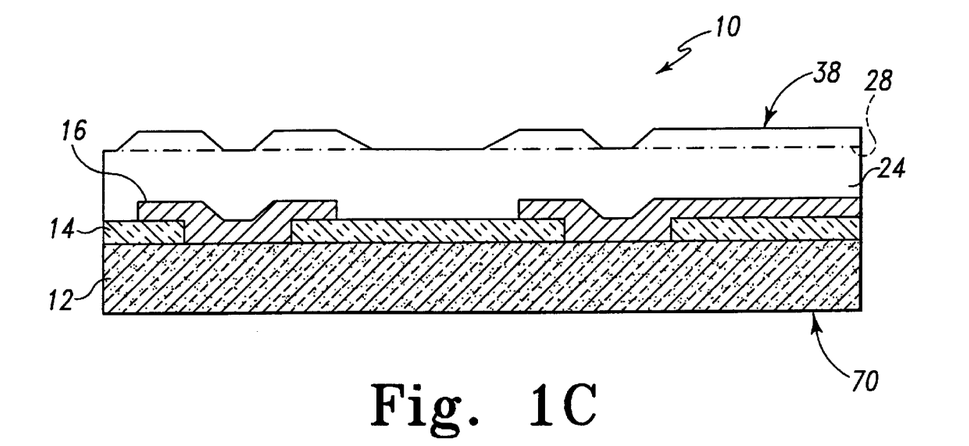
Figure 1D:
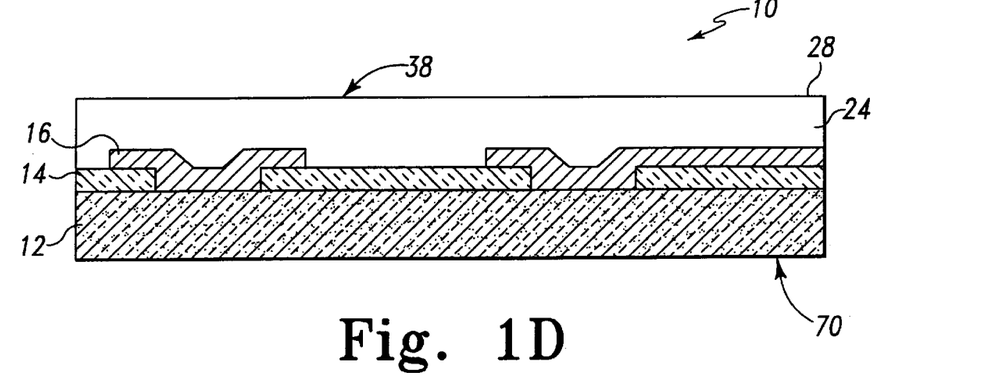

As shown in FIG. 1C, a second insulating layer 24 is deposited on the outer surface of the first insulating layer 14 and the first metal layer 16. The second insulating layer 24 has an uneven surface topography as a result of the varying topography associated with the first insulating layer 14 and a first metal layer 16. The uneven surface topography of the second insulating layer 24 may cause accuracy problems in fabricating additional layers associated with the semiconductor wafer 10. For example, the uneven surface topography may cause accuracy problems for a lithography process which is utilized to pattern a second metal layer 26 (FIG. 1F) on the second insulating layer 24. As shall be discussed below in more detail, in order to avoid such accuracy problems associated with the uneven topography of the second insulating layer 24, a polishing system, such as a polishing system 30 of FIG. 2, polishes the second insulating layer 24 so as to produce a planar surface 28 (see FIG. 1D) having a desired planarity level.

Figure 1E:
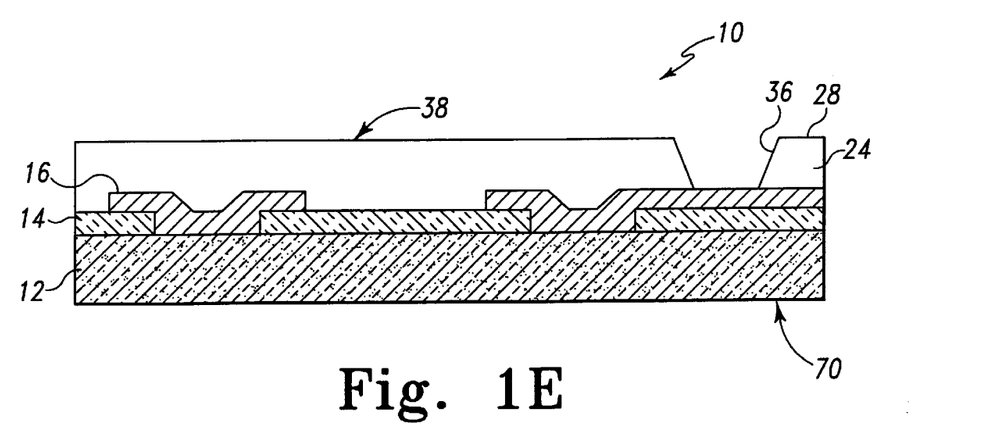
Figure 1F:
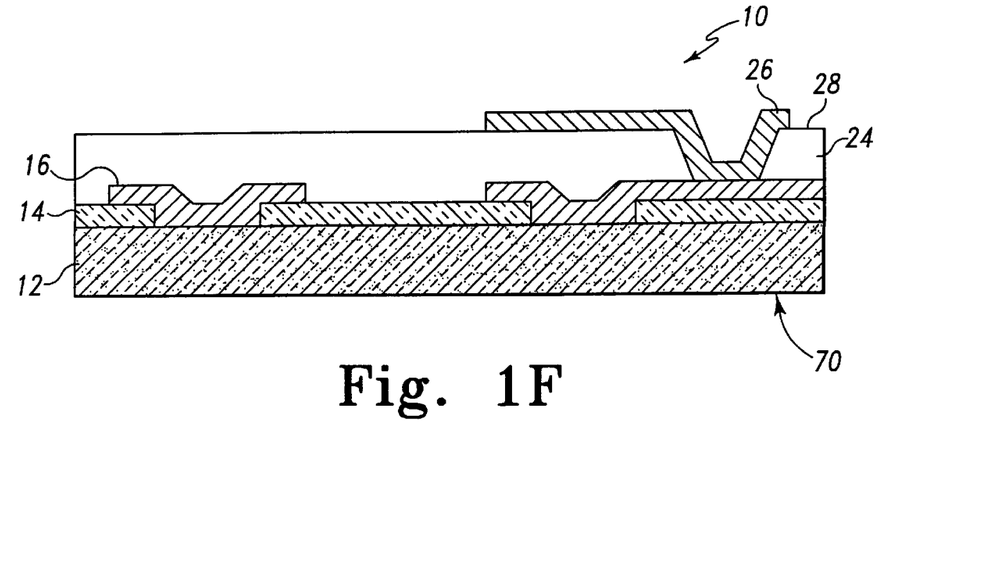

As alluded to above, once the semiconductor wafer 10 has been polished to the desired planarity level, additional layers may be deposited or otherwise fabricated thereon. For example, as shown in FIGS. 1E and 1F, a via hole 36 may be etched through the second insulating layer 24. Thereafter, the second metal layer 26 may be deposited on the second insulating layer 24. It should be appreciated that numerous additional layers may be deposited on the semiconductor wafer 10 in the manner previously described.

Figure 2:
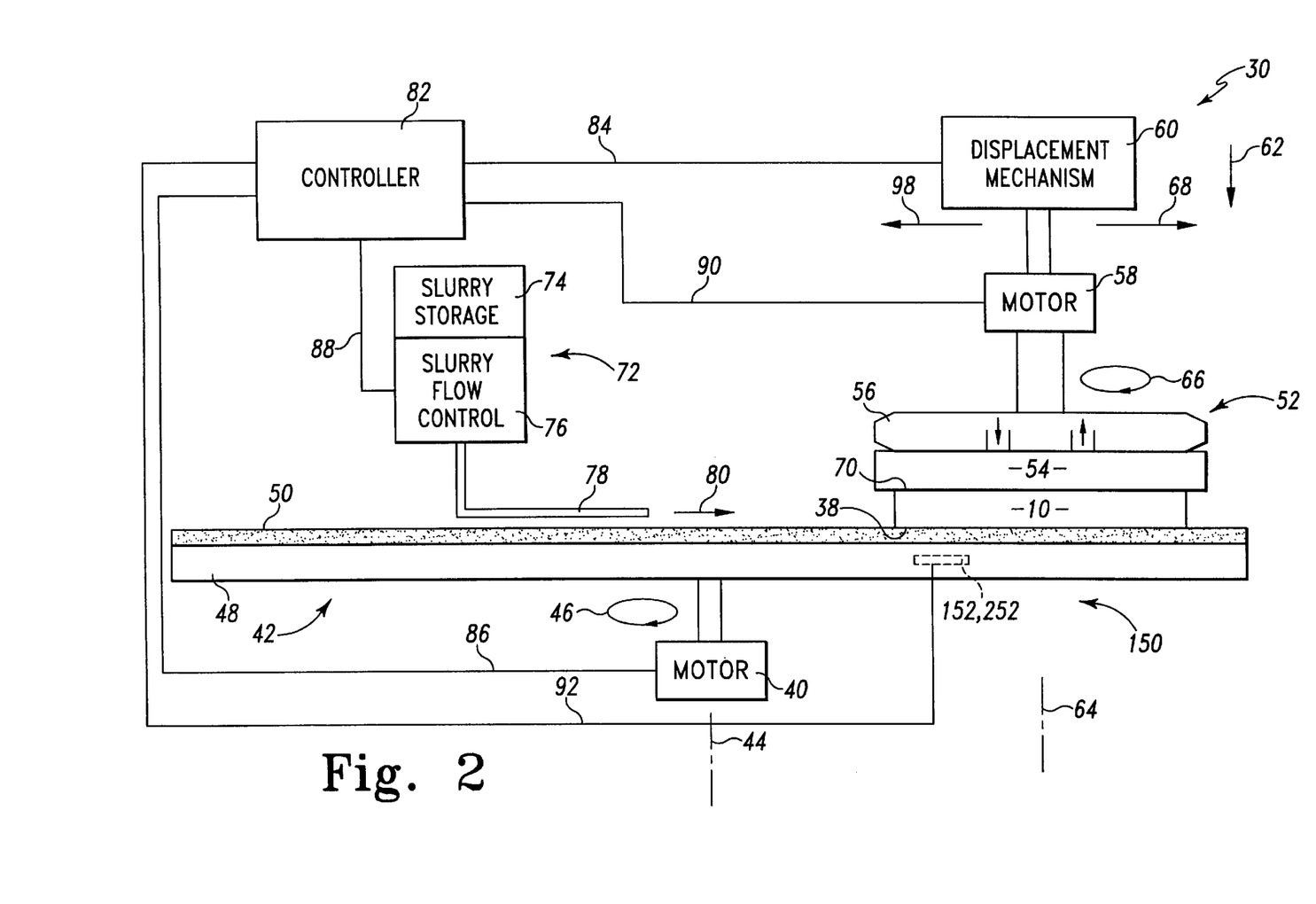
FIG. 2 is a diagrammatic view of a polishing system which incorporates various features of the present invention therein.

Referring now to FIG. 2, there is shown a preferred embodiment of the polishing system 30 which is used to planarize a front side or surface 38 of the semiconductor wafer 10. The polishing system 30 includes a platen motor or other drive mechanism 40 and a platen assembly 42. The platen motor 40 rotates the platen assembly 42 about a center axis 44. The platen motor 40 may rotate the platen assembly 42 in a clockwise direction (as shown by arrow 46 of FIG. 2) or in the counterclockwise direction.

The platen assembly 42 includes a polishing platen 48 and a polishing pad 50 mounted on the polishing platen 48. Both the polishing platen 48 and the polishing pad 50 are preferably circular and collectively define a polishing surface against which the front side 38 of the semiconductor wafer 10 may be polished. Moreover, the polishing pad 50 is typically made of blown polyurethane which protects the polishing platen 48 from chemical slurry and other chemicals introduced during the polishing process.

The polishing system 30 also includes a polishing head assembly 52. The polishing head assembly 52 includes a wafer carrier 54, a cooling mechanism 56, a wafer carrier motor or other drive mechanism 58, and a wafer carrier displacement mechanism 60. The wafer carrier 54 applies a controlled, adjustable force in the general direction of arrow 62 in order to press the front side 38 of the semiconductor wafer 10 into contact with the polishing pad 50 so as to facilitate polishing of the front side 38 of the semiconductor wafer 10.

The wafer carrier motor 58 rotates the wafer carrier 54 and the semiconductor wafer 10 about a center axis 64. The wafer carrier motor 58 may rotate the wafer carrier 54 in a clockwise direction (as shown by arrow 66 of FIG. 2) or in the counterclockwise direction. However, the wafer carrier motor 58 preferably rotates the wafer carrier 54 in the same rotational direction as the platen motor 40 rotates the platen assembly 42 (although the wafer carrier motor 58 may rotate the semiconductor wafer 10 in the rotational direction opposite the rotational direction of the platen assembly 42 as desired).

The wafer carrier 54 also includes mechanisms (not shown) for holding the semiconductor wafer 10. For example, the wafer carrier 54 may include a vacuum-type mechanism which generates a vacuum force that draws the semiconductor wafer 10 against the wafer carrier 54. Once the semiconductor wafer 10 is positioned on the wafer carrier 54 and held in contact with the platen assembly 42 for polishing, the vacuum force may be removed. In such an arrangement, the wafer carrier 54 may be designed with a friction surface or a carrier pad which engages a back side 70 of the semiconductor wafer 10 with a carrier ring (not shown). Such a carrier pad, along with the force being applied in the general direction of arrow 62, creates a frictional force between the wafer carrier 54 and the semiconductor wafer 10 that effectively holds the semiconductor wafer 10 against the wafer carrier 54 thereby causing the semiconductor wafer 10 to rotate at the same velocity as the wafer carrier 54. It should be appreciated that such wafer carriers and carrier pads are of conventional design and are commercially available.

The cooling mechanism 56 counteracts heat generated during the polishing process in order to maintain the wafer carrier 54 at a substantially constant temperature. In particular, the cooling mechanism 56 neutralizes the heat generated due to friction and a chemical slurry reacting with the front side 38 of the semiconductor wafer 10. Moreover, it should be appreciated that the polishing system 30 may also include an additional cooling mechanism (not shown) for cooling the components of the polishing assembly 42 (e.g. the polishing platen 48) during polishing of the semiconductor wafer 10.

The displacement mechanism 60 selectively moves the wafer carrier 54 and hence the semiconductor wafer 10 across the platen assembly 42 in the general direction of arrows 68 and 98. Such movement defines a polishing path which may be linear, sinusoidal, or a variety of other patterns. The displacement mechanism 60 is also capable of moving the semiconductor wafer 10 along a polishing path to a location beyond the edge of the polishing pad 50 so that the semiconductor wafer 10 "overhangs" the edge. Such an overhanging arrangement permits the semiconductor wafer 10 to be moved partially on and partially off the polishing pad 50 to compensate for polishing irregularities caused by a relative velocity differential between the faster moving outer portions and the slower moving inner portions of the platen assembly 42.

The polishing system 30 also includes a chemical slurry system 72. The slurry system 72 includes a slurry storage reservoir 74, a slurry flow control mechanism 76, and a slurry conduit 78. The slurry storage reservoir 74 includes one or more containers for storing slurry. In particular, the slurry storage reservoir 74 contains a chemical slurry that includes abrasive material which facilitates polishing of the front side 38 of the semiconductor wafer 10. Chemical slurries having such properties are well known and commercially available.

The slurry flow control mechanism 76 controls the flow of slurry from the slurry storage 74, through the slurry conduit 78, and onto the polishing area atop the platen assembly 42. Hence, the slurry flow control mechanism 76 and the slurry conduit 78 selectively introduce a flow of slurry (as indicated by arrow 80) atop the polishing pad 50.

Figure 4:
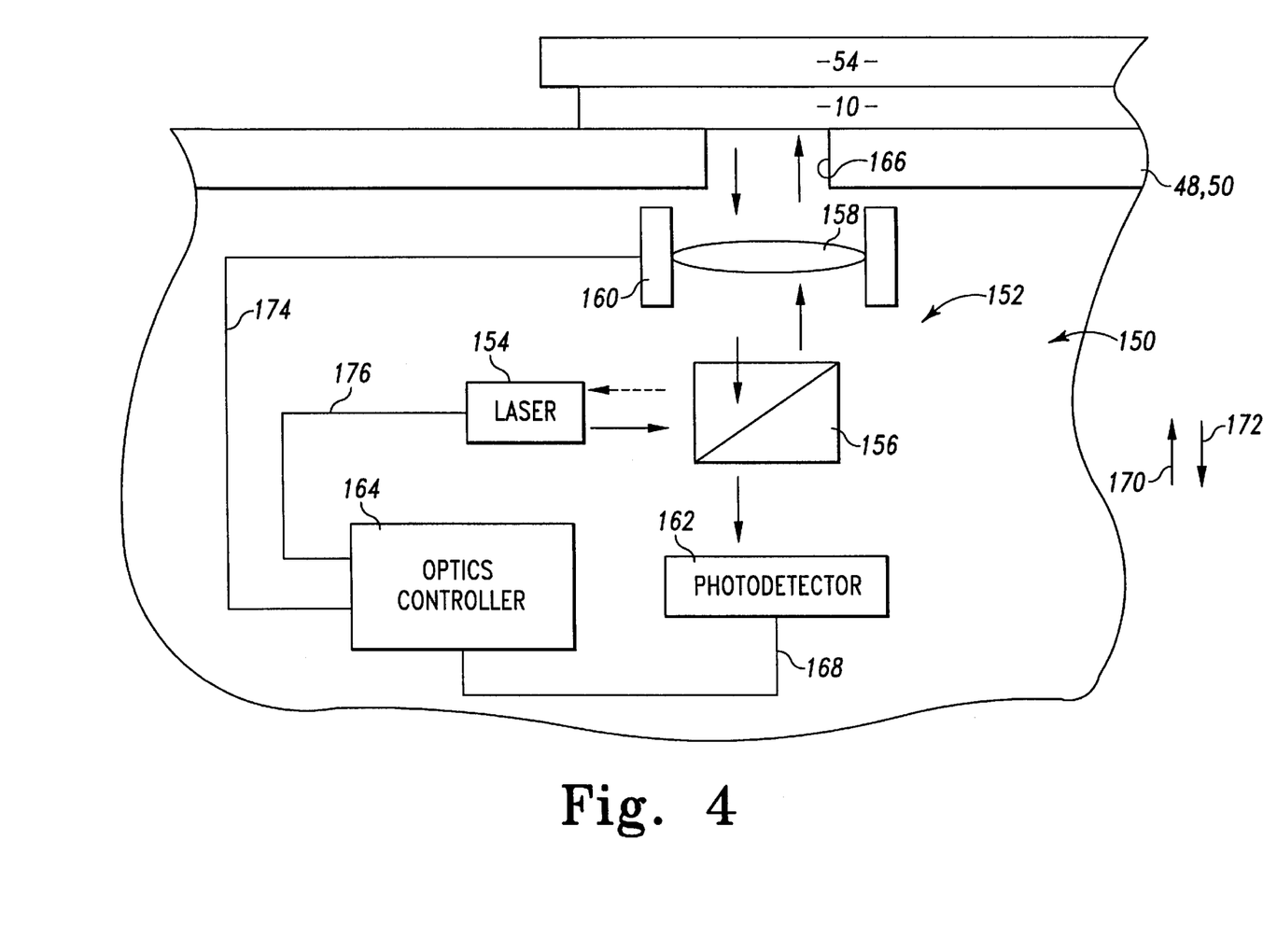
FIG. 4 is a diagrammatic view of a first embodiment of the confocal optical system associated with the polishing system of FIG. 2.

In order to determine when the polishing system 30 has polished the semiconductor wafer to the desired planarity level, there is provided an endpoint detection system 150. As shown in FIGS. 2 and 4, the endpoint detection system 150 includes an confocal optical system 152. The confocal optical system 152 includes a light source such as a laser light source 154, a beam splitter 156, an objective lens 158, a lens positioning device 160, a photodetector 162, and an optics controller 164. Preferably, the confocal optical system 152 is embodied as a confocal laser system. One such confocal laser system which is suitable for use as the confocal optical system 152 of the present invention is disclosed in U.S. Pat. No. 4,689,491 issued to Lindow et al, the disclosure of which is hereby incorporated by reference. Moreover, numerous types of commercially available confocal laser systems may also be utilized as the confocal optical system 152 of the present invention. One such commercially available confocal laser system which is particularly useful as the confocal optical system 152 of the present invention is a Model Number 1010 confocal laser system which is commercially available from KLA-Tencor Corporation of San Jose, Calif.

Figure 3:
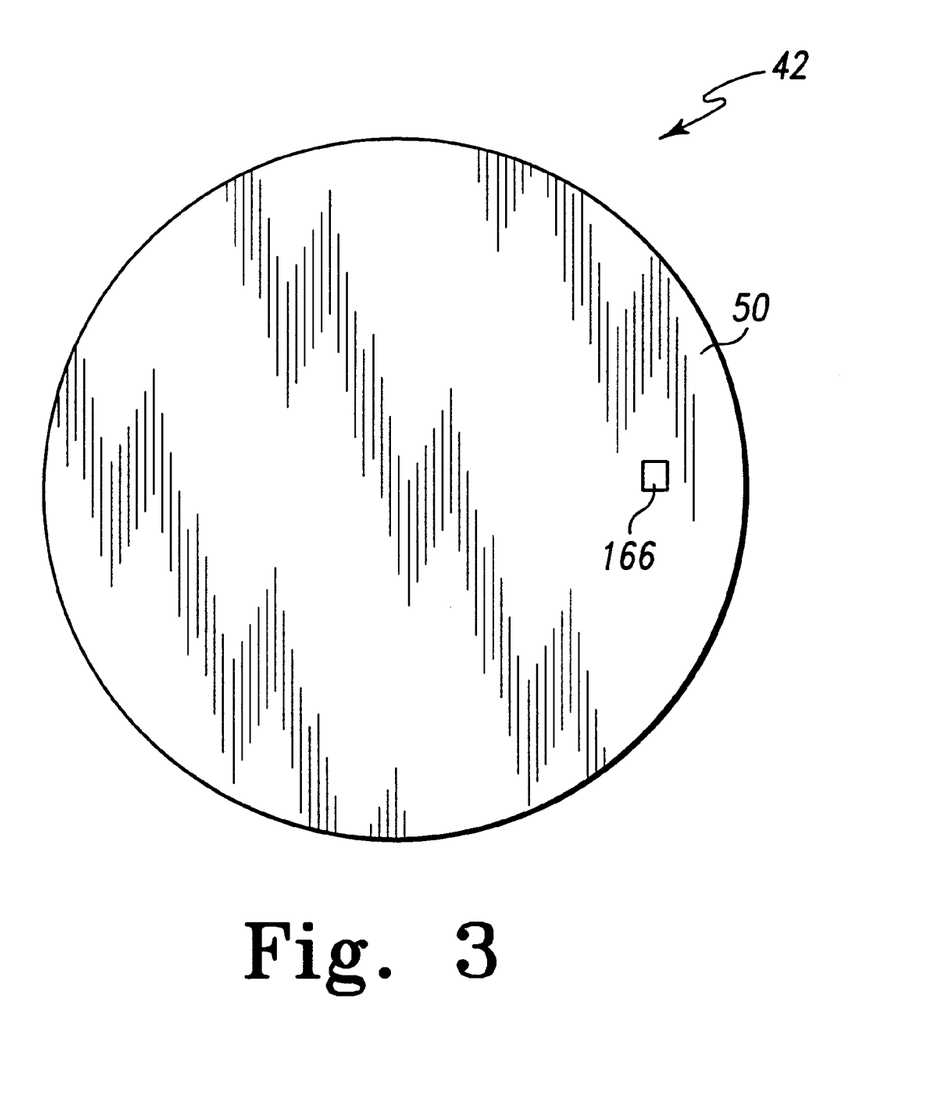
FIG. 3 is a top elevational view of the platen assembly of the polishing system of FIG. 2.

The confocal optical system 152 is provided to monitor polishing of the semiconductor wafer 10 in order to determine when the first side 38 thereof has been planarized to a desired level (i.e. when the planar surface 28 has been produced). In particular, during polishing of the semiconductor wafer 10, the confocal optical system generates incident laser beams which are directed through an opening 166 defined in the platen assembly 42 (see FIG. 3) and are impinged on the front side 38 of the semiconductor wafer 10. Reflected laser beams are reflected back to the confocal optical system 152 based on the degree of planarity of the front side of the semiconductor wafer 10. It should be appreciated that, as shall be discussed below in greater detail, the direction or directions in which incident laser beams is/are reflected or otherwise redirected is dependent on the surface topography of the front side 38 of the semiconductor wafer 10.

The optics controller 164 analyzes reflected laser beams in order to determine when the front side 38 of the semiconductor wafer 10 has been polished down to a desired planarity level. In particular, during polishing of the semiconductor wafer 10, the laser source 154 generates a laser beam which is directed into the beam splitter 156 so as to be directed through the objective lens 158, the opening 166 defined in the platen assembly 42 (see FIG. 3), and thereafter impinged on the front side 38 of the semiconductor wafer 10. Reflected laser beams are reflected back from a planar feature (if one is present) at the focal plane, through the opening 166, the objective lens 158, the beam splitter 156, and are thereafter detected by the photodetector 162. The output of the photodetector 162 is indicative of the intensity level of the reflected laser beam from the front side 38 of the wafer 10 and is transmitted to the optics controller 164 via a signal line 168. The optics controller 164 then adjusts the position of the objective lens 158 in order to focus the confocal optical system 152 on the front side 38 of the semiconductor wafer 10. In particular, the optics controller 164 determines if the intensity level of the reflected laser beam is within a predetermined light intensity range. The predetermined light intensity range is generally indicative of a maximum intensity level associated with reflected laser beams from a planar surface located at the focal plane of the confocal optical system 152. Hence, as used herein, the confocal optical system 152 is "focused" or "maintains focus" on the front side 38 of the semiconductor wafer 10 when the intensity level of reflected laser beams (as reflected from the front side 38 of the wafer 10) is within the predetermined light intensity range.

The optics controller 164 provides closed-loop control of the position of the objective lens 158 in order to maintain focus on the front side 38 of the semiconductor wafer 10. In particular, if the intensity level of a given reflected laser beam is not within the predetermined light intensity range thereby indicating that the confocal optical system 152 is not focused on the front side 38 of the semiconductor wafer 10, the optics controller 164 communicates with the lens positioning device 160 so as to move the objective lens 158 upwardly or downwardly (i.e. in the general directions of arrows 170 or 172 of FIG. 4, respectively) in order to focus the confocal optical system 152 onto the front side 38 of the semiconductor wafer 10. More specifically, the optics controller 164 generates an output signal on a signal line 174 thereby causing the lens positioning device 160 to move the objective lens 158 either upwardly or downwardly (as required). Thereafter, the optics controller 164 communicates with the laser source 154 via a signal line 176 in order to generate another incident laser beam which is impinged on the front side 38 of the semiconductor wafer 10 in the manner previously described. The intensity level of the reflected laser beam (as detected by the photodetector 162) is then compared to the predetermined light intensity range in order to determine if the confocal optical system 158 is focused on the front side 38 of the wafer 10. Thereafter, the position of the objective lens 158 may again be adjusted if the confocal optical system 152 is not focused on the front side of the semiconductor wafer 10.

It should be appreciated that such closed-loop control of the position of the objective lens 58 continues throughout operation of the polishing system 30. In particular, as the semiconductor wafer 10 continues to be polished, the optics controller 164 continuously adjusts the position of the objective lens 158 so as to maintain focus on the front side 38 of the wafer 10. During such a time, the movement of the objective lens 58 may be monitored in order to determine if the semiconductor wafer 10 has been polished to the desired planarity level. In particular, the intensity level of laser beams reflected from the front side 38 of the semiconductor wafer 10 changes as the wafer 10 is further polished by the polishing system 30. More specifically, when the front side 38 of the semiconductor wafer 10 has been polished down to the desired planarity level, incident laser beams impinged thereon are reflected directly back into the confocal optical system 152. It should be appreciated that such directly reflected laser beams have intensity levels associated therewith which are generally within the predetermined light intensity range.

In contrast, when the front side 38 of the semiconductor wafer 10 has not yet been polished down to the desired planarity level and therefore possesses an uneven or varying surface topography, such as shown in FIG. 1C, incident laser beams impinging thereon are scattered or otherwise reflected in numerous different directions thereby preventing detection thereof with the photodetector 162. As described above, if the optics controller 164 determines that the confocal optical system 152 is not focused on the front side 38 of the semiconductor wafer 10 (i.e. the reflected laser beam is either not detected at all by the photodetector 162 or the intensity level of the detected light is not within the predetermined light intensity range), the optics controller 164 causes the position of the objective lens 158 to be changed. Hence, during a given period of time, the objective lens 158 is repositioned a fewer number of times when the confocal optical system 152 is impinging laser beams on a relatively planar semiconductor wafer 10 in contrast to a wafer 10 which possesses an uneven or varying surface topography. This is true since the intensity level of laser beams reflected from a planar front side 38 of the wafer 10 will generally be within the predetermined light intensity range thereby eliminating the need to reposition of the objective lens 158. Conversely, during a similar period of time, the objective lens 158 is repositioned a large number of times when the confocal optical system 152 is impinging laser beams on a semiconductor wafer 10 which possesses an uneven or varying surface topography relative to a planar wafer 10. This is true since the intensity level of the laser beams reflected from an uneven front side 38 of the wafer 10 will generally not be within the predetermined light intensity range (if detected at all) thereby necessitating repositioning of the objective lens 158 a large number of times within the given period of time.

As can be seen from the above-discussion, the objective lens 158 has a rate-of-movement value which is dependent on the topography of the front side 38 of the semiconductor wafer 10. What is meant herein by the term "rate-of-movement value" is the number of occurrences during a given time period in which the objective lens 158 is repositioned or otherwise physically moved in order to focus the confocal optical system 152 on the front side 38 of the semiconductor wafer 10. Hence, the rate-of-movement value of the objective lens 158 decreases as the front side 38 of the semiconductor wafer 10 becomes more planar. In particular, the rate-of-movement value of the objective lens 158 will be relatively large when a given semiconductor wafer 10 is initially polished since the wafer 10 possesses a relatively uneven or varying topography, such as shown in FIG. 1C, during initial polishing thereof. However, as the semiconductor wafer 10 is further polished so as to approach the desired planarity level, the rate-of-movement value of the objective lens 158 will decrease.

In order to determine when the semiconductor wafer 10 has been polished to the desired planarity level, a movement threshold value may be established. The movement threshold value is indicative of the rate-of-movement value of the objective lens 158 when the confocal optical system 152 is focused on a semiconductor wafer 10 which has been polished to the desired planarity level (i.e. when the planar surface 28 has been produced). Hence, during polishing of a given semiconductor wafer 10, if the rate-of-movement value of the objective lens 158 has a predetermined relationship with the movement threshold value, the optics controller 164 determines that the wafer 10 has been polished to the desired planarity level. More specifically, during polishing of the given semiconductor wafer 10, if the rate-of-movement value of the objective lens 158 is equal to or less than the movement threshold value, the optics controller 164 generates a wafer-planarized control signal which indicates that the wafer 10 has been polished to the desired planarity level (i.e. when the planar surface 28 has been produced).

Figure 5:
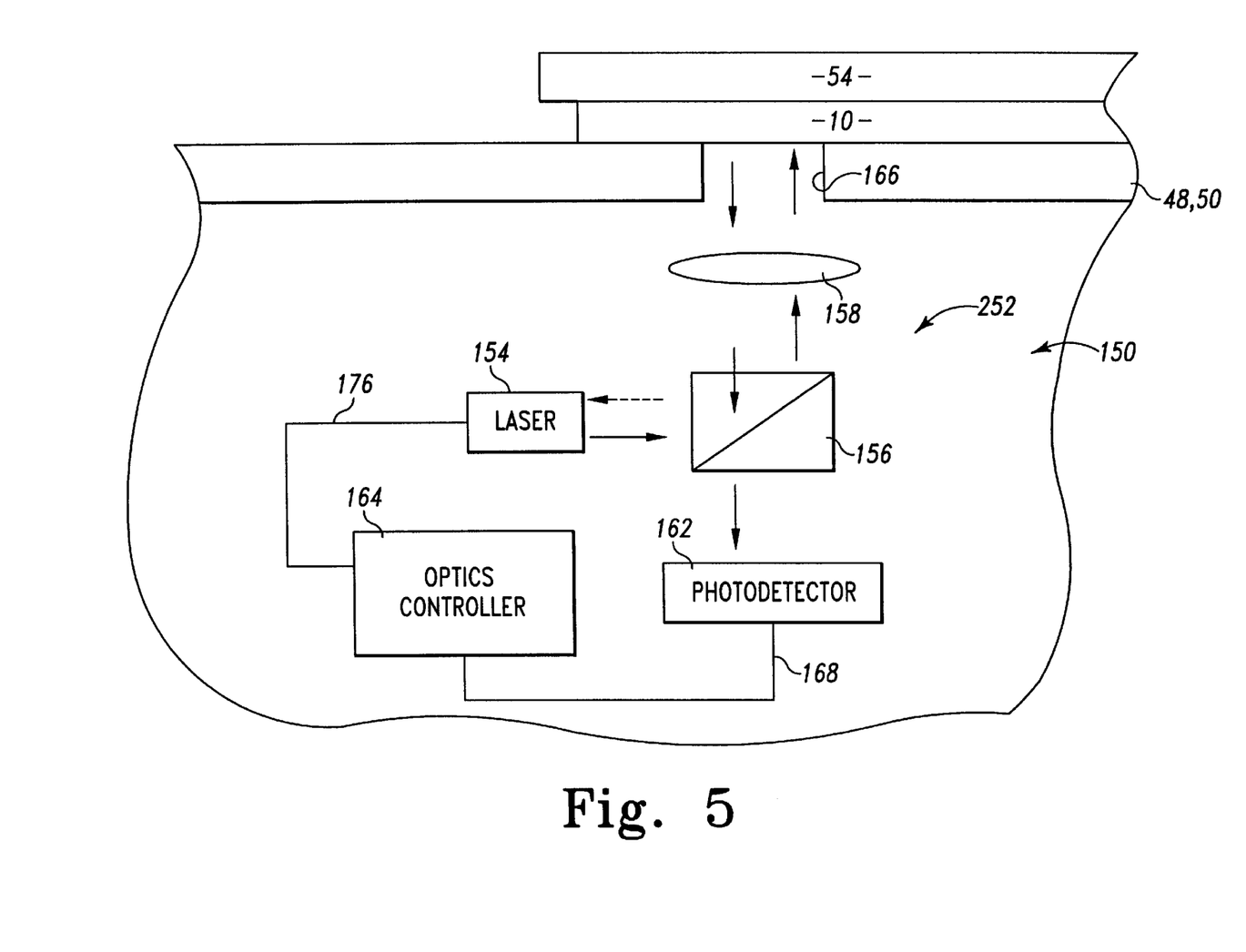
FIG. 5 is a view similar to FIG. 4, but showing a second embodiment of the confocal optical system.

Referring now to FIG. 5, there is shown a second embodiment of a confocal optical system 252 which incorporates the features of the present invention therein. The confocal optical system 252 is somewhat similar to the confocal optical system 152. Thus, the same reference numerals are used in FIG. 5 to designate common components which were previously discussed in regard to FIG. 4.

The confocal optical system 252 does not include a lens positioning device (i.e. the lens positioning device 160 of FIG. 4). Hence, the objective lens 158 is held stationary during operation of the confocal optical system 252 thereby preventing monitoring of the rate-of-movement value associated with the objective lens 158 during polishing of the semiconductor wafer 10. Therefore, the optics controller 164 monitors the number of occurrences during a given time period in which the confocal optical system 252 is focused on the front side 38 of the semiconductor wafer 10 in order to determine when the wafer 10 has been polished to the desired planarity level (i.e. when the planar surface 28 has been produced). In particular, during polishing of the semiconductor wafer 10, the confocal optical system 252 generates incident laser beams which are impinged upon the front side 38 of the semiconductor wafer 10 so as to produce reflected laser beams which are reflected from the front side 38 of the wafer 10. The photodetector 162 detects the intensity level of the reflected laser beams (if such beams are reflected back to the confocal optical system 252). The optics controller 164 then determines if the intensity level of the reflected laser beam is within the predetermined light intensity range. As described above, the predetermined light intensity range is generally indicative of a maximum intensity level associated with laser beams reflected from a planar surface of the front side 38 semiconductor wafer 10 which is located at the focal plane of the confocal optical system 252.

Hence, during polishing of the semiconductor wafer 10, if the optics controller 164 determines that during a predetermined period of time, the confocal optical system 252 is continuously focused on the front side 38 of the wafer 10, the optics controller 164 concludes that the wafer 10 has been polished to the desired planarity level (i.e. the planar surface 28 has been produced). More specifically, if during a predetermined period of time, the optics controller 164 determines that the intensity level of each of the laser beams reflected from the front side 38 of the wafer 10 is within the predetermined light intensity range, the optics controller 164 generates a wafer-planarized control signal which indicates that the wafer 10 has been polished to the desired planarity level (i.e. the planar surface 28 has been produced).

However, if during the predetermined period of time, the optics controller 164 determines that the intensity level of a number of the laser beams reflected from the front side 38 of the wafer 10 is not within the predetermined light intensity range, the optics controller 164 does not generate a wafer-planarized control signal. As shall be discussed below in more detail, absence of the wafer-planarized control signal causes the polishing system 30 to continue polishing the semiconductor wafer 10.

Referring back to FIG. 2, the polishing system 30 also includes a polishing controller 82 for controlling the polishing system 30 in order to effectuate the desired polishing results for the semiconductor wafer 10. In particular, the polishing controller 82 is electrically coupled to the displacement mechanism 60 via a signal line 84 to monitor and controllably adjust the polishing path of the semiconductor wafer 10 and the speed at which the semiconductor wafer 10 is moved across the platen assembly 42.

Moreover, the polishing controller 82 is electrically coupled to the platen motor 40 via a signal line 86 in order to monitor the output speed of the platen motor 40 and hence the rotational velocity of the platen assembly 42. The polishing controller 82 adjusts the output speed of the platen motor 40 and hence the rotational velocity of the platen assembly 42 as required by predetermined operating parameters.

The polishing controller 82 is electrically coupled to the slurry flow control mechanism 76 via a signal line 88 in order to monitor the flow rate of the chemical slurry onto the polishing pad 50 of the platen assembly 42. The polishing controller 82 adjusts the flow rate of the chemical slurry onto the polishing pad 50 of the platen assembly 42 as required by predetermined operating parameters.

The polishing controller 82 is further electrically coupled to the wafer carrier motor 58 via a signal line 90 in order to monitor the output speed of the wafer carrier motor 58 and hence the rotational velocity of the wafer carrier 54. The polishing controller 82 adjusts the output speed of the wafer carrier motor 58 and hence the rotational velocity of the wafer carrier 54 as required by predetermined operating parameters. It should be appreciated that upon polishing the semiconductor wafer 10 to the desired planarity level, the wafer carrier motor 58 may be idled so as to cease polishing of the semiconductor wafer 10. What is meant herein by the term "idled" is that power is cutoff to the wafer carrier motor 58 thereby preventing the wafer carrier motor 58 from driving or otherwise contributing mechanical work to the rotation of the wafer carrier 54.

The polishing controller 82 is also electrically coupled to the confocal optical system 152, 252 via a signal line 92 in order to determine when the semiconductor wafer 10 has been polished to the desired planarity level (i.e. the planar surface 28 has been produced). In particular regard to when the endpoint detection system 150 is embodied to include the confocal optical system 152 (as opposed to the confocal optical system 252), the polishing controller 82 is configured to determine the rate-of-movement value of the objective lens 158 and thereafter determine if the rate-of-movement value of the objective lens 158 has a predetermined relationship (e.g. is less than or equal to) the movement threshold value. More specifically, the polishing controller 82 is configured to scan or otherwise read the signal line 92 in order to determine if the confocal optical system 152 has generated a wafer-planarized control signal which, as described above, is indicative of the rate-of-movement value of the objective lens 158 having a predetermined relationship (e.g. is less than or equal to) the movement threshold value.

In particular regard to when the endpoint detection system 150 includes the confocal optical system 252, the polishing controller 82 is configured to analyze laser beams reflected from the front side 38 of the semiconductor wafer 10 in order to determine if the confocal optical system 252 is continuously focused on the front side 38 of the wafer 10 for a predetermined period of time. More specifically, the polishing controller 82 is configured to scan or otherwise read the signal line 92 in order to determine if the confocal optical system 252 has generated a wafer-planarized control signal which, as described above, is indicative of the confocal optical system 252 being continuously focused on the front side 38 of the wafer 10 for a predetermined period of time.

In operation, the polishing system 30 polishes the semiconductor wafer 10 in order to planarize the front side 38 thereof. In particular, the polishing system 30 removes material from the front side 38 of the semiconductor wafer 10 until the wafer 10 is polished to the desired planarity level (i.e. the planar surface 28 has been formed). More specifically, the wafer carrier 54 engages the back side 70 of the semiconductor wafer 10 and presses the front side 38 of the semiconductor wafer 10 against the polishing pad 50. The polishing controller 82 then causes the platen motor 40 to rotate the platen assembly 42 and the wafer carrier motor 58 to rotate the wafer carrier 54. The polishing controller 82 may also begin to control the displacement mechanism 60 so as to move the wafer carrier 54 along a predetermined polishing path. The slurry flow control mechanism 76 is also controlled by the polishing controller 82 in order to apply chemical slurry to the polishing pad 50 at a predetermined flow rate. The resulting complex movement of the wafer carrier 54 relative to the polishing pad 50, the downward force being applied to the semiconductor wafer 10 in the general direction of arrow 62 of FIG. 2, and the chemical slurry all cooperate to selectively remove material from the front side 38 of the semiconductor wafer 10.

In addition, the polishing controller 82 communicates with the confocal optical system 152, 252 in order to determine if the semiconductor wafer 10 has been polished the desired planarity level. In particular, the confocal optical system 152, 252 generates incident laser beams which are impinged on the front side 38 of the wafer 10 during polishing thereof thereby forming reflected laser beams which are reflected from the front side 38 of the wafer 10. The reflected laser beams are then analyzed (if detected at all by the photodetector 162) by the confocal optical system 152, 252.

In particular regard to the confocal optical system 152, the intensity level of the reflected laser beams causes repositioning of the objective lens 158 in the manner discussed above. If the rate-of-movement value of the objective lens 158 is less than or equal to a movement threshold, the confocal optical system 152 generates a wafer-planarized control signal which is sent to the polishing controller 82. In response to receiving the wafer-planarized control signal, the polishing controller 82 ceases polishing the semiconductor wafer 10.

In regard to the confocal optical system 252, the intensity level of the reflected laser beams is utilized to determine if the confocal optical system 252 is continuously focused on the front side 38 of the semiconductor wafer 10. In particular, if during a predetermined period of time, the confocal optical system 252 determines that the intensity level of each of the laser beams reflected from the front side 38 of the wafer 10 is within the predetermined light intensity range, the confocal optical system 252 generates a wafer-planarized control signal which is sent to the polishing controller 82. In response to receiving the wafer-planarized control signal, the polishing controller 82 ceases polishing the semiconductor wafer 10.

Figure 6:
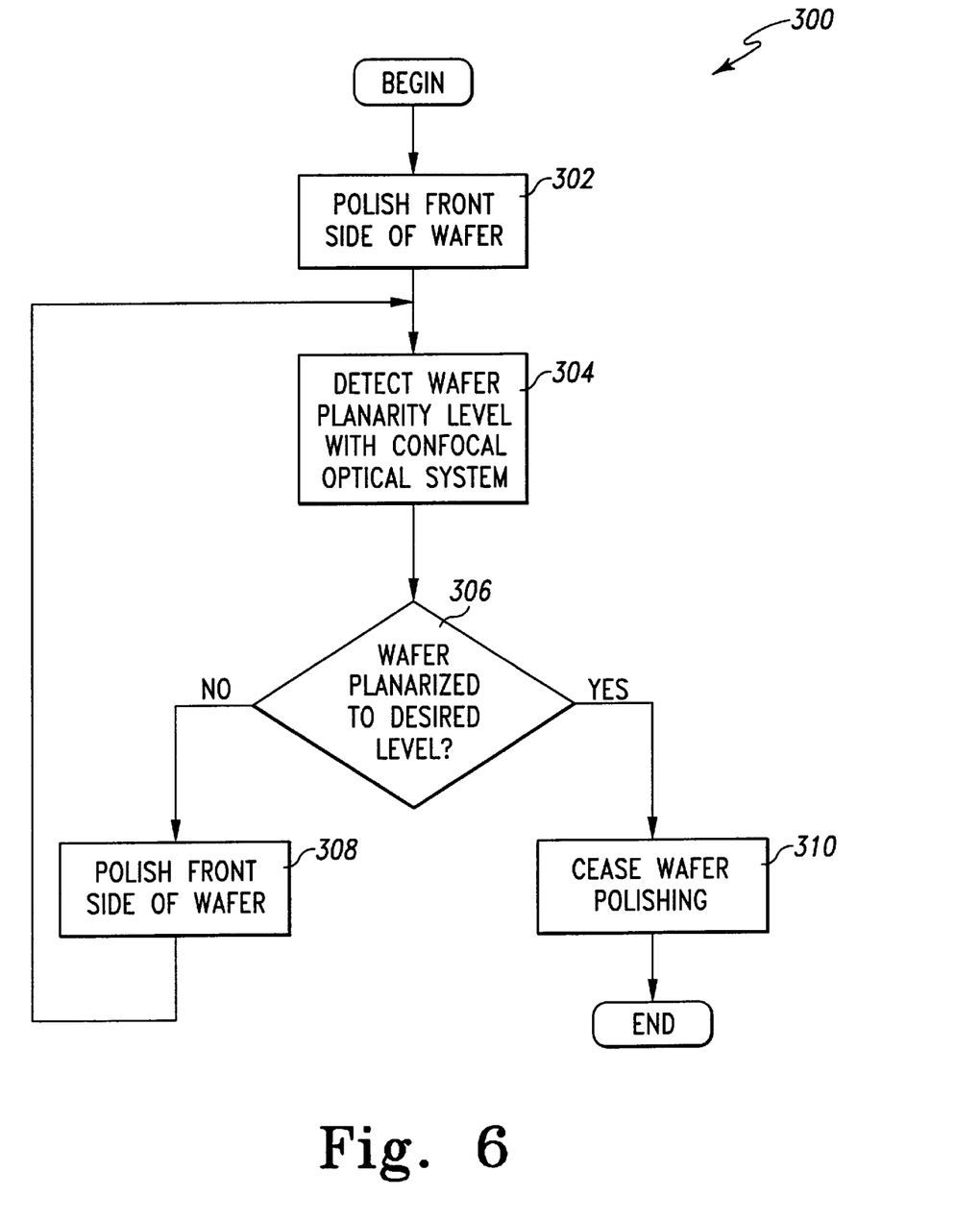
FIG. 6 shows a flowchart of a polishing procedure used by the polishing system of FIG. 2.

A polishing procedure 300 utilized by the polishing system 30 to polish the semiconductor wafer 10 according to the present invention is shown in FIG. 6. The polishing procedure 300 begins with step 302 in which the polishing controller 82 causes the polishing system 30 to begin polishing the front side 38 of the semiconductor wafer 10 in order to remove material therefrom. In particular, the polishing controller 82 actuates the platen motor 40 in order to cause the platen assembly 42 to be rotated. Thereafter, the polishing controller 82 actuates the wafer carrier motor 58 thereby causing the wafer carrier 54 and hence the semiconductor wafer 10 to be rotated so as to polish the front side 38 of the semiconductor wafer 10 against the rotating platen assembly 42. The polishing controller 82 also actuates the displacement mechanism 60 in order to cause the displacement mechanism 60 to selectively move the wafer carrier 54 and hence the wafer 10 along a predetermined polishing path. Moreover, the polishing controller 82 causes the chemical slurry supply system 72 to apply chemical slurry to the polishing pad 50 of the platen assembly 42 in order to facilitate the removal of material from the front side 38 of the semiconductor wafer 10. The procedure 300 then advances to step 304.

In step 304, the polishing controller 82 communicates with the confocal optical system 152, 252 in order to detect the planarity level of the semiconductor wafer 10 during polishing thereof. In particular, the optics controller 164 generates an output signal on the signal line 176 (see FIGS. 4 and 5) thereby causing the laser source 154 to generate incident laser beams which are impinged upon the front side 38 of the semiconductor wafer 10. Reflected laser beams which are reflected from the front side 38 of the semiconductor wafer 10 are directed through the objective lens 158 (if reflected in a direction toward the confocal optical system 152, 252), the beam splitter 156, and thereafter detected by the photodetector 162. The reflected laser beams are then analyzed by the confocal optical system 152, 252.

In particular regard to the confocal optical system 152, the intensity level of the reflected laser beams causes repositioning of the objective lens 158 in the manner discussed above in regard to FIG. 4. If the rate-of-movement value of the objective lens 158 is less than or equal to a movement threshold value, the confocal optical system 152 generates a wafer-planarized control signal which is sent to the polishing controller 82. If the rate-of-movement value of the objective lens 158 is greater than the movement threshold value, a wafer-planarized control signal is not generated by the confocal optical system 152.

In regard to the confocal optical system 252, the intensity level of the reflected laser beams is utilized to determine if the confocal optical system 252 is continuously focused on the front side 38 of the semiconductor wafer 10. In particular, if during a predetermined period of time, the confocal optical system 252 determines that the intensity level of each of the laser beams reflected from the front side 38 of the wafer 10 is within the predetermined light intensity range, the confocal optical system 252 generates a wafer-planarized control signal which is sent to the polishing controller 82. However, if during the predetermined period of time, the optics controller 164 determines that the intensity level of a number of the laser beams reflected from the front side 38 of the wafer 10 is not within the predetermined light intensity range, the optics controller 164 does not generate a wafer-planarized control signal.

The procedure then advances to step 306 in which the polishing controller 82 determines if the front side 38 of the semiconductor wafer 10 has been polished to the desired planarity level. In particular, the polishing controller 82 scans or otherwise reads the signal line 92 in order to determine if the confocal optical system 152, 252 has generated a wafer-planarized control signal. As described above, presence of a wafer-planarized control signal on the signal line 92 indicates that the semiconductor wafer 10 has been polished to the desired planarity level (i.e. the planar surface 28 has been formed). Hence, in step 306, if the polishing controller 82 does not detect presence of a wafer-planarized control signal on the signal line 92, the polishing controller 82 concludes that the front side 38 of the semiconductor wafer 10 has not been polished to the desired planarity level, and the procedure 300 advances to step 308. However, if the polishing controller 82 does detect generation of a wafer-planarized control signal on the signal line 92, the polishing controller 82 concludes that the front side 38 of the semiconductor wafer 10 has been polished to the desired planarity level, and the procedure 300 advances to step 310.

In step 308, the polishing controller 82 communicates with the platen motor 40, the wafer carrier motor 58, the displacement mechanism 60, and the slurry flow control 76 in order to continue polishing the semiconductor wafer 10 in the manner previously discussed. The procedure 300 then loops back to step 304 in order to further monitor the planarization of the semiconductor wafer 10 during subsequent polishing thereof.

Returning now to step 306, if the front side 38 of the semiconductor wafer 10 has been polished to the desired planarity level, the procedure 300 advances to step 310. In step 310, the polishing controller 82 ceases polishing of the semiconductor wafer 10. In particular, the polishing controller 82 communicates with the platen motor 40, the wafer carrier motor 58, the displacement mechanism 60, and the slurry flow control 76 in order to cease polishing of the semiconductor wafer 10. However, it should be appreciated that the polishing controller 82 may allow the polishing system 30 to continue polishing the semiconductor wafer 10 for a short, predetermined amount of time in order to further remove material from the semiconductor wafer 10. This further removal of material or overpolishing may be desirable after certain steps of a fabrication process. The procedure 300 then ends thereby placing the polishing system 30 in an idle state until actuated to polish a subsequent semiconductor wafer.

While the invention has been illustrated and described in detail in the drawings and foregoing description, such illustration and description is to be considered as exemplary and not restrictive in character, it being understood that only preferred embodiments have been shown and described and that all changes and modifications that come within the spirit of the invention are desired to be protected.

For example, although the confocal optical system 152 is herein described as monitoring the rate-of-movement value of the objective lens 158, and thereby producing numerous advantages in the present invention, certain of such advantages may be achieved by monitoring other values in order to determine when the semiconductor wafer 10 has been polished down to the desired planarity level. For example, the confocal optical system 152 may be configured to monitor a range-of-movement value associated with the objective lens 158. What is meant herein by the term "range-of-movement value" is the physical distance in which the objective lens 158 is repositioned or otherwise physically moved during a given time period in order to focus the confocal optical system 152 on the front side 38 of the semiconductor wafer 10. It should be appreciated that during a given period of time, the objective lens 158 is repositioned a fewer number of times (and therefore traverses a relatively small distance) when the confocal optical system 152 is impinging laser beams on a relatively planar semiconductor wafer 10 in contrast to a wafer 10 which possesses an uneven or varying surface topography. This is true since the intensity level of laser beams reflected from a planar front side 38 of the wafer 10 will generally be within the predetermined light intensity range thereby eliminating the need to reposition of the objective lens 158. Conversely, during a similar period of time, the objective lens 158 is repositioned a large number of times (and therefore traverses a relatively large distance) when the confocal optical system 152 is impinging laser beams on a semiconductor wafer 10 which possesses an uneven or varying surface topography relative to a planar wafer 10. This is true since the intensity level of the laser beams reflected from an uneven front side 38 of the wafer 10 will generally not be within the predetermined light intensity range (if detected at all) thereby necessitating repositioning of the objective lens 158 a large number of times within the given period of time.

For further example, it should be appreciated that although the polishing system 30 and the confocal optical system 152, 252 are herein described as having separate controllers (i.e. the polishing controller 82 and the optics controller 164, respectively), it should be appreciated that a single controller may be provided to control both the polishing system 30 and the confocal optical system 152, 252.

What is claimed is:

1. A method of planarizing a first side of a semiconductor wafer with a polishing system, comprising the steps of:

polishing said first side of said wafer in order to remove material from said wafer;

moving a lens of a confocal optical system between a number of lens positions so as to maintain focus on said first side of said wafer during said polishing step;

determining a rate-of-movement value based on movement of said lens during said moving step; and stopping said polishing step if said rate-of-movement value has a predetermined relationship with a movement threshold value.

2. The method of claim 1, wherein said stopping step includes the step of stopping said polishing step if said rate-of-movement value is less than said movement threshold value.

3. The method of claim 1, wherein:

said polishing step includes the step of rotating said wafer with a wafer motor, and said stopping step includes the step of idling said wafer motor if said rate-of-movement value has said predetermined relationship with said movement threshold.

4. The method of claim 1, wherein:

said polishing step includes the step of rotating a wafer carrier so as to urge said wafer into contact with a polishing platen, and said confocal optical system is positioned such that an incident light beam emitting therefrom is directed through an opening defined in said polishing platen so as to impinge upon said first side of said wafer.

5. The method of claim 1, wherein said moving step includes the step of moving an objective lens of said confocal optical system between said number of lens positions so as to maintain focus on said first side of said wafer during said polishing step.

6. An apparatus for polishing a first side of a semiconductor wafer, comprising:

a polishing system which operates to polish said wafer, said polishing system having (i) a polishing platen which includes a polishing surface, and (ii) a wafer carrier which is configured to (a) engage said wafer by a second side of said wafer, and (b) apply pressure to said wafer in order to press said wafer against said polishing surface of said polishing platen;

a confocal optical system having a movable objective lens, said confocal optical system being configured to move said objective lens between a number of lens positions so as to maintain focus on said first side of said wafer during polishing of said wafer; and a controller electrically coupled to said confocal optical system, wherein said controller is configured to (i) determine a rate-of-movement value based on movement of said objective lens during polishing of said wafer, and (ii) terminate operation of said polishing system so as to cease polishing of said wafer in response to determination that said rate-of-movement value has a predetermined relationship with a movement threshold value.

7. The apparatus of claim 6, further comprising a wafer motor, wherein:

said wafer motor is operable in (i) a polishing mode of operation in which said wafer motor rotates said wafer carrier, and (ii) an idle mode of operation in which said wafer motor is idle, and said wafer motor is positioned in said idle mode of operation if said rate-of-movement value has said predetermined relationship with said movement threshold.

8. The apparatus of claim 6, wherein:

said polishing platen has an opening defined therein, and said confocal optical system is positioned such that an incident light beam emitting therefrom is directed through said opening defined in said polishing platen so as to be impinged upon said first side of said wafer.

9. The apparatus of claim 8, wherein:

said confocal optical system includes a confocal laser system, said incident light beam includes an incident laser beam generated by said confocal laser system, and said confocal laser system is positioned such that said incident laser beam is directed through said opening defined in said polishing platen so as to impinge said incident laser beam on said first side of said wafer.

10. The apparatus of claim 6, wherein said controller is further configured to terminate operation of said polishing system so as to cease polishing of said wafer in response to determination that said rate-of-movement value is less than said movement threshold value.

* * * * *